US010785879B2

(12) United States Patent
Katoh et al.

(10) Patent No.: US 10,785,879 B2
(45) Date of Patent: Sep. 22, 2020

(54) CIRCUIT BOARD AND PRODUCTION METHOD THEREFOR

(71) Applicant: NGK SPARK PLUG CO., LTD., Nagoya-shi, Aichi (JP)

(72) Inventors: Tatsuya Katoh, Nagoya (JP); Masanori Ito, Nagoya (JP); Masaki Kutsuna, Ohbu (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/031,828

(22) Filed: Jul. 10, 2018

(65) Prior Publication Data

US 2018/0324957 A1 Nov. 8, 2018

Related U.S. Application Data

(62) Division of application No. 15/543,253, filed as application No. PCT/JP2016/000079 on Jan. 8, 2016, now abandoned.

(30) Foreign Application Priority Data

Jan. 13, 2015 (JP) ................................ 2015-003819

(51) Int. Cl.
*H05K 3/40* (2006.01)
*H05K 3/28* (2006.01)
(Continued)

(52) U.S. Cl.
CPC .............. *H05K 3/40* (2013.01); *B32B 9/005* (2013.01); *C03C 4/14* (2013.01); *C03C 10/0054* (2013.01);
(Continued)

(58) Field of Classification Search
CPC .......... H05K 3/1291; H05K 3/10; H05K 3/12; H05K 3/28; H05K 3/282;
(Continued)

(56) References Cited

U.S. PATENT DOCUMENTS 4,218,581 A * 8/1980 Suzuki ................. H01B 7/0823
174/117 F
4,279,654 A * 7/1981 Yajima .................... C03C 10/00
264/332
(Continued)

FOREIGN PATENT DOCUMENTS

JP H05-298918 A 11/1993
JP H06-019926 B2 3/1994
(Continued)

OTHER PUBLICATIONS

European Patent Office, Extended European Search Report issued in corresponding Application No. 16737189.7, dated Jul. 27, 2018.
(Continued)

*Primary Examiner* — Peter Dungba Vo
*Assistant Examiner* — Kaying Kue
(74) *Attorney, Agent, or Firm* — Stites & Harbison, PLLC; Jeffrey A. Haeberlin; James R. Hayne

(57) ABSTRACT

A method of manufacturing a circuit substrate includes the steps of preparing a conductor paste in which a powder of at least one of a metal boride and a metal silicide is added to a powder of silver (Ag), applying the conductor paste to a surface of a ceramic substrate which has been fired, applying a glass paste to the surface of the ceramic substrate after applying the conductor paste, firing the conductor paste applied to the surface so as to form a conductor trace, and firing the glass paste applied to the surface so as to form a coating layer.

6 Claims, 4 Drawing Sheets

(51) Int. Cl.
*H05K 1/09* (2006.01)
*H05K 3/12* (2006.01)
*H05K 3/46* (2006.01)
*C03C 4/14* (2006.01)
*C03C 10/00* (2006.01)
*H05K 1/03* (2006.01)
*H05K 1/02* (2006.01)
*H05K 3/32* (2006.01)
*C04B 35/63* (2006.01)
*H01L 23/15* (2006.01)
*B32B 9/00* (2006.01)

(52) U.S. Cl.
CPC .......... *C04B 35/6303* (2013.01); *H01L 23/15* (2013.01); *H05K 1/0296* (2013.01); *H05K 1/0306* (2013.01); *H05K 1/09* (2013.01); *H05K 1/092* (2013.01); *H05K 3/12* (2013.01); *H05K 3/1291* (2013.01); *H05K 3/28* (2013.01); *H05K 3/285* (2013.01); *H05K 3/321* (2013.01); *H05K 3/4061* (2013.01); *H05K 3/46* (2013.01); *H05K 3/4664* (2013.01); *B32B 2307/202* (2013.01); *C03C 2204/00* (2013.01); *C04B 2237/40* (2013.01); *C04B 2237/704* (2013.01); *H05K 3/4629* (2013.01); *H05K 2201/017* (2013.01); *H05K 2201/0769* (2013.01); *H05K 2203/1126* (2013.01); *Y10T 29/49163* (2015.01); *Y10T 428/12458* (2015.01)

(58) Field of Classification Search
CPC .. H05K 3/281–288; H05K 3/40; H05K 3/285; H05K 3/46; H05K 3/321; H05K 3/4629; H05K 1/092; H05K 1/09; H05K 1/0306; H05K 1/0296; Y10T 29/49155; Y10T 29/49156–49165; H01L 23/15
USPC ............................................ 29/846, 847–851
See application file for complete search history.

(56) References Cited

U.S. PATENT DOCUMENTS

| | | | | |
|---|---|---|---|---|
| 4,639,391 A | * | 1/1987 | Kuo | C03C 3/064 252/520.22 |
| 4,830,878 A | * | 5/1989 | Kaneko | H01L 27/013 257/E27.115 |
| 5,458,709 A | * | 10/1995 | Kamezaki | H01L 21/4807 156/89.18 |
| 5,593,722 A | * | 1/1997 | Otani | H01C 17/242 257/E21.534 |
| 5,857,253 A | * | 1/1999 | DeLong | B21C 37/292 29/412 |
| 2002/0145134 A1 | * | 10/2002 | Olding | C04B 41/4537 252/500 |
| 2003/0235711 A1 | * | 12/2003 | Seido | C23C 28/00 428/660 |
| 2005/0219802 A1 | * | 10/2005 | Kobayashi | H01G 9/0032 361/523 |
| 2007/0023388 A1 | | 2/2007 | Nair et al. | |
| 2008/0074005 A1 | * | 3/2008 | Sano | H03H 9/173 310/363 |
| 2009/0034157 A1 | * | 2/2009 | Saito | H03H 7/0115 361/321.4 |
| 2012/0276401 A1 | * | 11/2012 | Nakayama | H01L 23/49866 428/596 |
| 2013/0186675 A1 | * | 7/2013 | Takahashi | H05K 1/0306 174/253 |
| 2014/0177241 A1 | * | 6/2014 | Ohta | C03B 19/06 362/382 |

FOREIGN PATENT DOCUMENTS

| | | |
|---|---|---|
| JP | H06-204511 A | 7/1994 |
| JP | H06-252524 A | 9/1994 |
| JP | H07-135394 A | 5/1995 |
| JP | H09-246722 A | 9/1997 |
| JP | H11-066951 A | 3/1999 |
| JP | H11-339560 A | 12/1999 |
| JP | 2001-278657 A | 10/2001 |
| JP | 2006-073280 A | 3/2006 |
| JP | 2006-253600 A | 9/2006 |
| JP | 2007-059390 A | 3/2007 |
| JP | 4797534 B2 | 3/2007 |
| JP | 2007-234537 A | 9/2007 |
| JP | 2014-179473 A | 9/2014 |
| WO | 2014-026910 A1 | 2/2014 |

OTHER PUBLICATIONS

Korean Intellectual Property Office, Office Action (Notice of Reason for Refusal) issued in corresponding Application No. 10-2017-7019497, dated Dec. 7, 2018.

Japan Patent Office, Office Action issued in corresponding Application No. JP 2016-541726, dated Jun. 20, 2017.

Japan Patent Office, International Search Report issued in corresponding Application No. PCT/JP2016/000079, dated Apr. 5, 2016.

Japan Patent Office, Written Opinion issued in corresponding Application No. PCT/JP2016/000079, dated Apr. 5, 2016.

* cited by examiner

| Sample | Conductor Paste | | | Material of Glass Paste | Firing Temperature (°C) | Silver Diffusion Distance (μm) | Evaluation |
|---|---|---|---|---|---|---|---|
| | Primary Material | Additive Material | Amount (vol.%) | | | | |
| S01 | Ag | $LaB_6$ | 15 | $SiO_2$-$B_2O_3$-CaO glass | 850 | Less than 5 | AA |
| S02 | Ag | $SiB_6$ | 15 | $SiO_2$-$B_2O_3$-CaO glass | 850 | Less than 5 | AA |
| S03 | Ag | $TiB_2$ | 15 | $SiO_2$-$B_2O_3$-CaO glass | 850 | Less than 5 | AA |
| S04 | Ag | $ZrSi_2$ | 15 | $SiO_2$-$B_2O_3$-CaO glass | 850 | Less than 5 | AA |
| S05 | Ag | $TaSi_2$ | 15 | $SiO_2$-$B_2O_3$-CaO glass | 850 | Less than 5 | AA |
| S06 | Ag | $LaB_6$ | 9 | $SiO_2$-$B_2O_3$-CaO glass | 850 | Less than 5 | AA |
| S07 | Ag | $LaB_6$ | 3 | $SiO_2$-$B_2O_3$-CaO glass | 850 | Less than 5 | AA |
| S08 | Ag | $LaB_6$ | 15 | $Na_2O$-ZnO-$B_2O_3$ glass | 600 | Less than 5 | AA |
| S09 | Ag | None | - | $SiO_2$-$B_2O_3$-CaO glass | 850 | Greater than 10 | XX |
| S10 | Ag | None | - | $Na_2O$-ZnO-$B_2O_3$ glass | 600 | Greater than 10 | XX |

FIG. 3

CIRCUIT BOARD AND PRODUCTION METHOD THEREFOR

TECHNICAL FIELD

The present invention relates to a circuit substrate and to a method of manufacturing the same.

BACKGROUND ART

Some circuit substrates include a ceramic substrate mainly formed of alumina, mullite, silicon nitride, aluminum nitride, a glass ceramic, or the like.

There has been known a circuit substrate which includes a ceramic substrate and in which a conductor trace mainly formed of silver (Ag) and a coating layer are formed on a surface of the ceramic substrate. The coating layer contains a glass component and covers the conductor trace (refer to Patent Document 1). The coating layer is also referred to as an overcoat glass layer. The conductor trace and the coating layer are formed by applying a conductor paste and a glass paste to a surface of the ceramic substrate and firing them.

PRIOR ART DOCUMENTS

Patent Documents

Patent Document 1: Japanese Patent Application Laid-Open (kokai) No. H7-135394

SUMMARY OF THE INVENTION

Problem to be Solved by the Invention

The technique disclosed in Patent Document 1 has the following problem. When the conductor trace and the coating layer are formed by firing, the silver component of the conductor trace diffuses into the coating layer, which may deteriorate electrical insulation performance of the coating layer and change the color of the coating layer. It is considered that diffusion of the silver component into the coating layer is accelerated by oxidation of the silver component of the conductor trace.

Means for Solving the Problem

The present invention has been accomplished to solve the above-described problem. The present invention can be realized as follows.

(1) One mode of the present invention is a method of manufacturing a circuit substrate including a ceramic substrate having a surface mainly formed of a ceramic, a conductor trace formed on the surface of the ceramic substrate and mainly formed of silver (Ag), and a coating layer which contains a glass component and which is formed on the surface of the ceramic substrate and covers the conductor trace. The manufacturing method includes a step of firing the ceramic substrate, a step of preparing a conductor paste in which a powder of at least one of a metal boride and a metal silicide is added to a powder of silver (Ag), a step of applying the conductor paste to the surface of the fired ceramic substrate, a step of applying a glass paste to the surface of the ceramic substrate after applying the conductor paste, a step of firing the conductor paste applied to the surface so as to form the conductor trace, and a step of firing the glass paste applied to the surface so as to form the coating layer. According to this mode, at least one of the metal boride and the metal silicide added to the conductor paste oxidizes during firing. Therefore, diffusion of the silver component of the conductor trace into the coating layer can be prevented. As a result, it is possible to prevent deterioration of the electrical insulation performance of the coating layer and change of the color of the coating layer. Thus, the quality of the circuit substrate can be improved.

(2) In the manufacturing method of the above-mentioned mode, the metal boride added to the conductor paste may be at least one of lanthanum hexaboride ($LaB_6$), silicon hexaboride ($SiB_6$), and titanium diboride ($TiB_2$). This mode prevents diffusion of the silver component from the conductor trace into the coating layer.

(3) In the manufacturing method of the above-mentioned mode, the metal silicide added to the conductor paste may be at least one of zirconium disilicide ($ZrSi_2$) and tantalum disilicide ($TaSi_2$). This mode prevents diffusion of the silver component from the conductor trace into the coating layer.

(4) In the manufacturing method of the above-mentioned mode, the total amount of the metal boride and the metal silicide with respect to the amount of the inorganic component of the conductor paste may be 3 vol. % to 15 vol. %. This mode can sufficiently prevent diffusion of the silver component from the conductor trace into the coating layer.

(5) In the manufacturing method of the above-mentioned mode, the step of preparing the conductor paste may include a step of causing the powder of at least one of the metal boride and the metal silicide to adhere to surfaces of powder particles of silver (Ag). This mode prevents diffusion of the silver component from the conductor trace into the coating layer to a greater degree.

(6) In the manufacturing method of the above-mentioned mode, the conductor trace and the coating layer may be formed at the same time by firing the conductor paste and the glass paste together. This mode simplifies the production process compared with the case where the conductor trace and the coating layer are formed separately.

(7) In the manufacturing method of the above-mentioned mode, the glass paste is applied to the surface of the ceramic substrate after the conductor trace is formed by firing the conductor paste. According to this mode, diffusion of the silver component from the conductor trace into the coating layer is prevented to a greater degree.

(8) One mode of the present invention provides a circuit substrate including a ceramic substrate having a surface mainly formed of a ceramic, a conductor trace which is formed on the surface of the ceramic substrate and which is formed mainly of silver (Ag), and a coating layer which contains a glass component and which is formed on the surface of the ceramic substrate and covers the conductor trace. In the circuit substrate, the concentration of either silicon atoms (Si) or boron atoms (B) contained in the coating layer increases toward the conductor trace in a region located adjacent to conductor traces. According to this mode, it is possible to prevent deterioration of the electrical insulation performance of the coating layer and change of the color of the coating layer. Thus, the quality of the circuit substrate can be improved.

The present invention is not limited to a circuit substrate and a method of manufacturing the same and can be realized in various other forms. For example, the present invention can be realized in the form of a device including a circuit substrate, a manufacturing apparatus for manufacturing a circuit substrate, etc.

BRIEF DESCRIPTION OF THE DRAWINGS

FIG. 3 Table showing the results of an evaluation test.

MODES FOR CARRYING OUT THE INVENTION

A. Embodiment

Figure 1:
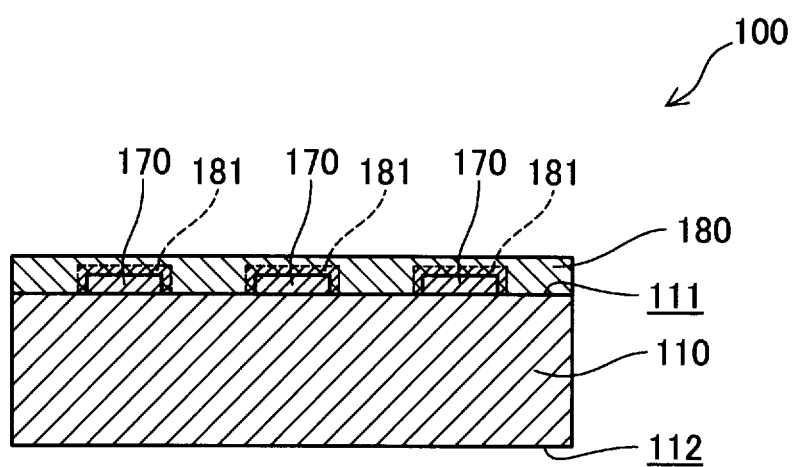
FIG. 1 Explanatory view schematically showing a cross section of a circuit substrate.

FIG. 1 is an explanatory view schematically showing a cross section of a circuit substrate 100. At least a portion of a circuit for realizing a predefined function is formed on the circuit substrate 100. In the present embodiment, a circuit for transmitting signals to electronic components is formed on the circuit substrate 100. The circuit substrate 100 includes a ceramic substrate 110, conductor traces 170, and a coating layer 180.

The ceramic substrate 110 of the circuit substrate 100 is a plate-shaped ceramic member. In the present embodiment, the ceramic substrate 110 is mainly formed of a glass ceramic. In this description, "mainly formed of (a component)" means that the component accounts for at least 50 mass % of the entirety. In another embodiment, the main component of the ceramic substrate 110 may be any of other types of ceramic materials such as alumina, mullite, silicon nitride, and aluminum nitride. In the present embodiment, the ceramic substrate 110 is a low temperature fired ceramic substrate. The ceramic substrate 110 has a structure in which a plurality of insulating ceramic layers (unillustrated) are laminated. In the present embodiment, the ceramic substrate 110 has an unillustrated conductor layer, unillustrated vias, and unillustrated through holes as conductors which form the circuit.

The ceramic substrate 110 has surfaces 111 and 112. The surface 112 is a backside surface opposite the surface 111. Conductor traces 170 and a coating layer 180 are formed on the surface 111. In another embodiment, like the surface 111, a conductor trace 170 and a coating layer 180 may be formed on the surface 112.

The surfaces 111 and 112 are mainly formed of a ceramic. In the present embodiment, the surfaces 111 and 112 are surfaces of ceramic layers formed by firing powders of borosilicate glass and alumina ($Al_2O_3$). Borosilicate glass is mainly formed of silicon dioxide ($SiO_2$), alumina ($Al_2O_3$), and boron oxide ($B_2O_3$).

The conductor trace 170 of the circuit substrate 100 is an electrically conductive ceramic formed on the surface 111 of the ceramic substrate 110. The conductor trace 170 is mainly formed of silver (Ag). In the present embodiment, the conductor trace 170 contains powders of silver (Ag) and borosilicate glass, and has electrical conductivity. In the present embodiment, each conductor trace 170 is covered entirely by the coating layer 180. In another embodiment, a portion of each conductor trace 170 may be exposed out of the coating layer 180. In the present embodiment, each conductor trace 170 has a thickness of about 10 μm.

The coating layer 180 of the circuit substrate 100 is an electrically insulating ceramic formed on the surface 111 of the ceramic substrate 110. The coating layer 180 contains a glass component. The coating layer 180 is also referred to as an overcoat glass layer. In the present embodiment, the coating layer 180 is mainly formed of a glass ceramic. In the present embodiment, the coating layer 180 is an electrically insulating ceramic formed by firing powders of borosilicate glass and alumina ($Al_2O_3$). The coating layer 180 covers at least a portion of each conductor trace 170. In the present embodiment, the coating layer 180 has a thickness of about 10 to 20 μm.

The coating layer 180 includes regions 181 located adjacent to the conductor traces 170. In the regions 181 located adjacent to conductor traces 170, the concentration of silicon atoms (Si) and/or boron atoms (B) contained in the coating layer 180 increases toward the conductor traces 170.

Figure 2:
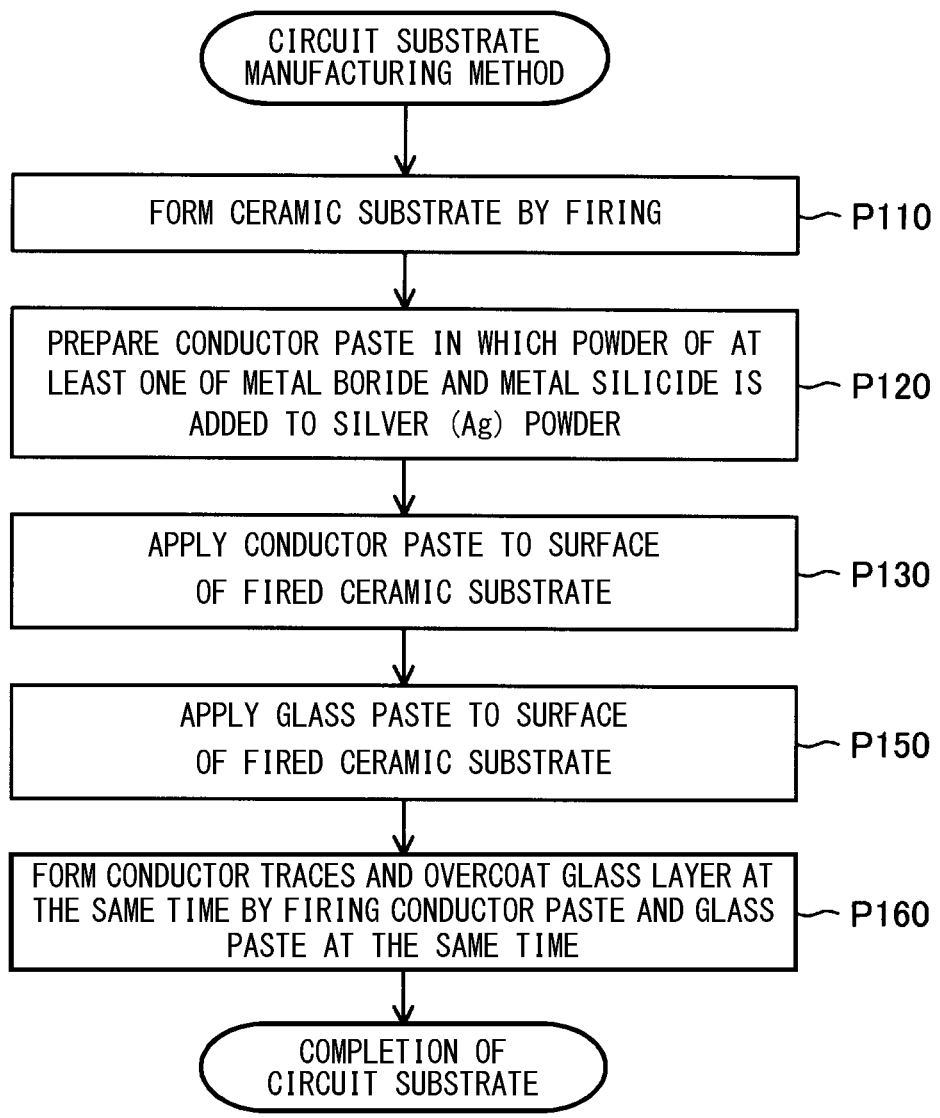
FIG. 2 Flowchart showing a method of manufacturing the circuit substrate.

FIG. 2 is a flowchart showing a method of manufacturing the circuit substrate 100. First, the ceramic substrate 110 is formed by firing (step P110).

As a preparation for forming the ceramic substrate 110, a green sheet which is the material of the ceramic substrate 110 is prepared. The green sheet is formed by mixing a binder, a plasticizer, a solvent, etc., into powders of inorganic components and forming the resultant mixture into the shape of a thin plate (sheet). In the present embodiment, powders of borosilicate glass and alumina which are inorganic component are weighed such that their volume ratio becomes 60:40 and the total weight becomes 1 kg. These powders are placed in a container (pot) formed of alumina. Subsequently, 120 g of acrylic resin serving as a binder, a proper amount of methyl ethyl ketone (MEK) serving as a solvent, and a proper amount of dioctyl phthalate (DOP) serving as a plasticizer are added to the materials (powders) in the pot. The materials in the pot are mixed for five hours to thereby obtain a ceramic slurry. Then, a green sheet is made from the ceramic slurry using the doctor blade method. In the present embodiment, the green sheet has a thickness of 0.15 mm. In the present embodiment, the green sheet is formed into a desired shape by means of punching.

After preparing the green sheet, a conductor paste is applied to the green sheet. In the present embodiment, the conductor paste is prepared by mixing a binder, a plasticizer, a solvent, etc. into powders of inorganic components; i.e., a powdery mixture of silver (Ag) and borosilicate glass. In the present embodiment, after ethyl cellulose serving as a binder and terpineol serving as a solvent are added to the powder of inorganic components, the resultant material is kneaded with a triple roll mill, whereby the conductor paste is obtained. Subsequently, the conductor paste is applied to the green sheet by means of screen printing and hole-filling printing.

After applying the conductor paste to the green sheet, a plurality of the green sheets are laminated to form a laminate. In the present embodiment, by cutting operation, the laminate is formed into a shape suitable for firing. In the present embodiment, the laminate is exposed to an atmosphere of 250° C. for 10 hours for debindering.

After preparing the laminate, the laminate is fired to thereby form the ceramic substrate 110. In the present embodiment, the laminate is fired by being exposed to an atmosphere of 900° C. for 60 minutes. After these steps, the ceramic substrate 110 is obtained.

After forming the ceramic substrate 110 (step P110), a conductor paste which is the pre-firing form of the conductor traces 170 is prepared (step P120). The conductor paste which is the pre-firing form of the conductor traces 170 is prepared by adding a powder of at least one of a metal boride and a metal silicide to a powder of silver (Ag).

From the viewpoint of preventing diffusion of silver into the coating layer 180, the metal boride to be added to the conductor paste is preferably at least one of lanthanum hexaboride ($LaB_6$), silicon hexaboride ($SiB_6$), and titanium diboride ($TiB_2$). From the viewpoint of preventing diffusion of silver into the coating layer 180, the metal silicide to be added to the conductor paste is preferably at least one of zirconium disilicide ($ZrSi_2$) and tantalum disilicide ($TaSi_2$).

From the viewpoint of sufficiently preventing diffusion of silver into the coating layer 180, the total amount of the metal boride and the metal silicide with respect to the amount of the inorganic component of the conductor paste is preferably 3 vol. % to 15 vol. %.

In the present embodiment, for preparing the conductor paste which is the pre-firing form of the conductor traces 170, a mixture of silver (Ag) powder which is an electrically conductive material and borosilicate glass powder which is common with the ceramic substrate 110 is prepared as an inorganic component material of the conductor paste. Subsequently, a powder of at least one of the metal boride and the metal silicide, ethyl cellulose serving as a binder, and terpineol serving as a solvent are added to the mixture of inorganic components. The resultant material is kneaded with a triple roll mill, whereby the conductor paste is obtained.

After preparation of the conductor paste (step P120), the conductor paste is applied to the surface 111 of the ceramic substrate 110 which has been fired (step P130). In the present embodiment, the conductor paste is applied to the ceramic substrate 110 by means of screen printing.

After the conductor paste is applied to the ceramic substrate (step P130), a glass paste which is the pre-firing form of the coating layer 180 is applied to the surface 111 of the ceramic substrate 110 carrying the conductor paste applied thereto (step P150). In the present embodiment, a mixture of borosilicate glass powder and alumina powder is prepared as an inorganic component material of the glass paste. Subsequently, ethyl cellulose serving as a binder and terpineol serving as a solvent are added to the mixture of powders of inorganic components. The resultant mixture is kneaded with a triple roll mill, whereby the glass paste is obtained. In the present embodiment, the glass paste is applied to the surface 111 of the ceramic substrate 110 by means of screen printing.

After applying the glass paste to the ceramic substrate 110 (step P150), the conductor paste and the glass paste applied to the surface 111 of the ceramic substrate 110 are fired to thereby form the conductor traces 170 and the coating layer 180 (step P160). In the present embodiment, the ceramic substrate 110 carrying the conductor paste and the glass paste applied thereto is exposed to an atmosphere of 850° C. for 60 minutes to fire the conductor paste and the glass paste. Thus, the conductor traces 170 and the coating layer 180 are formed on the surface 111 of the ceramic substrate 110. After these steps, the circuit substrate 100 is completed.

When the conductor traces 170 and the coating layer 180 are formed by firing, oxygen near the conductor paste is consumed by oxidation of the additive component(s) (at least one of the metal boride and the metal silicide) contained in the conductor paste. As a result, oxidation of the silver component contained in the conductor paste is prevented. Thus, diffusion of the silver component into the coating layer 180 is prevented.

At least a portion of the additive component(s) oxidized during firing diffuses into the regions 181, which are located adjacent to the conductor traces 170, of the coating layer 180. Therefore, in the regions 181 located adjacent to the coating layer 170, the concentration of silicon atoms (Si) and/or boron atoms (B) contained in the coating layer 180 increases toward the conductor traces 170.

FIG. 3 is a table showing the results of an evaluation test. In the evaluation test whose results are shown in FIG. 3, samples S01 to S10 of the circuit substrate 100 were made through use of different conductor pastes and different glass pastes. In the table of FIG. 3, the amount of the additive(s) in the conductor paste which is the pre-firing form of the conductor traces 170 is shown as the amount (volume percent) of the additive(s) with respect to the amount of the inorganic component of the conductor paste.

The method of preparing the samples S01 to S07 is the same as that described with reference to FIG. 2. The method of preparing the sample S08 is the same as that described with reference to FIG. 2 except that the borosilicate glass powder contained in the material of each member of the circuit substrate 100 is substituted with a powder of $Na_2$—$ZnO$—$B_2O_3$ glass and that the firing temperature for the conductor paste and the glass paste is 600° C. The method of preparing the sample S09 is the same as that described with reference to FIG. 2 except that the metal boride and the metal silicide are not added to the conductor paste. The method of preparing the sample S10 is the same as that for the sample S08 except that the metal boride and the metal silicide are not added to the conductor paste.

A cross section of each sample was observed using a scanning electron microscope (SEM) and an electron probe micro analyzer (EPMA) to measure the distance of diffusion of silver into the coating layer 180. The concentration of silver (Ag) at the interface between each conductor trace 170 and the coating layer 180 was used as a reference concentration, and the distance between the interface and a position in the coating layer 180 at which the concentration of silver (Ag) becomes half the reference concentration was measured at 10 points. The average of the measured distances was obtained as a silver diffusion distance.

Each sample was evaluated on the basis of the following criteria.

AA (excellent): The silver diffusion distance is less than 5 μm.

XX (poor): The silver diffusion distance is equal to or greater than 5 μm.

The evaluation results of the samples S01 to S03 and S09 show that diffusion of silver into the coating layer 180 can be prevented by adding one of lanthanum hexaboride ($LaB_6$), silicon hexaboride ($SiB_6$), and titanium diboride ($TiB_2$), which are metal borides, to the conductor paste which is the material of the conductor traces 170.

The evaluation results of the samples S04, S05, and S09 show that diffusion of silver into the coating layer 180 can be prevented by adding one of zirconium disilicide ($ZrSi_2$) and tantalum disilicide ($TaSi_2$), which are metal silicides, to the conductor paste which is the material of the conductor traces 170.

The evaluation results of the samples S01 to S07 show that diffusion of silver into the coating layer 180 can be sufficiently prevented when the total amount of the metal boride and the metal silicide with respect to the amount of the inorganic component of the conductor paste which is the material of the conductor traces 170 is 3 vol. % to 15 vol. %.

The evaluation results of the samples S01, S08, S09, and S10 show that, even if the material of the glass paste is a powder of $Na_2$—$ZnO$—$B_2O_3$ glass, diffusion of silver into the coating layer 180 can be prevented as in the case where the material of the glass paste is borosilicate glass.

According to the embodiment described above, at least one of the metal boride and the metal silicide added to the conductor paste oxidizes during firing. Therefore, diffusion of the silver component of the conductor traces 170 into the coating layer 180 can be prevented. As a result, it is possible to prevent deterioration of the electrical insulation performance of the coating layer 180 and change of the color of the coating layer 180. Thus, the quality of the circuit substrate 100 can be improved.

The metal boride added to the conductor paste may be at least one of lanthanum hexaboride ($LaB_6$), silicon hexaboride ($SiB_6$), and titanium diboride ($TiB_2$). This prevents diffusion of the silver component from the conductor traces into the coating layer.

The metal silicide added to the conductor paste may be at least one of zirconium disilicide ($ZrSi_2$) and tantalum disilicide ($TaSi_2$). This prevents diffusion of the silver component from the conductor traces into the coating layer.

When the total amount of the metal boride and the metal silicide with respect to the amount of the inorganic component of the conductor paste is 3 vol. % to 15 vol. %, diffusion of the silver component from the conductor traces 170 into the coating layer 180 can be sufficiently prevented.

Since the conductor traces 170 and the coating layer 180 are formed at the same time by firing the conductor paste and the glass paste together (step P160), the production process can be simplified compared with the case where the conductor traces 170 and the coating layer 180 are formed separately.

B. Second Embodiment

Figure 4:
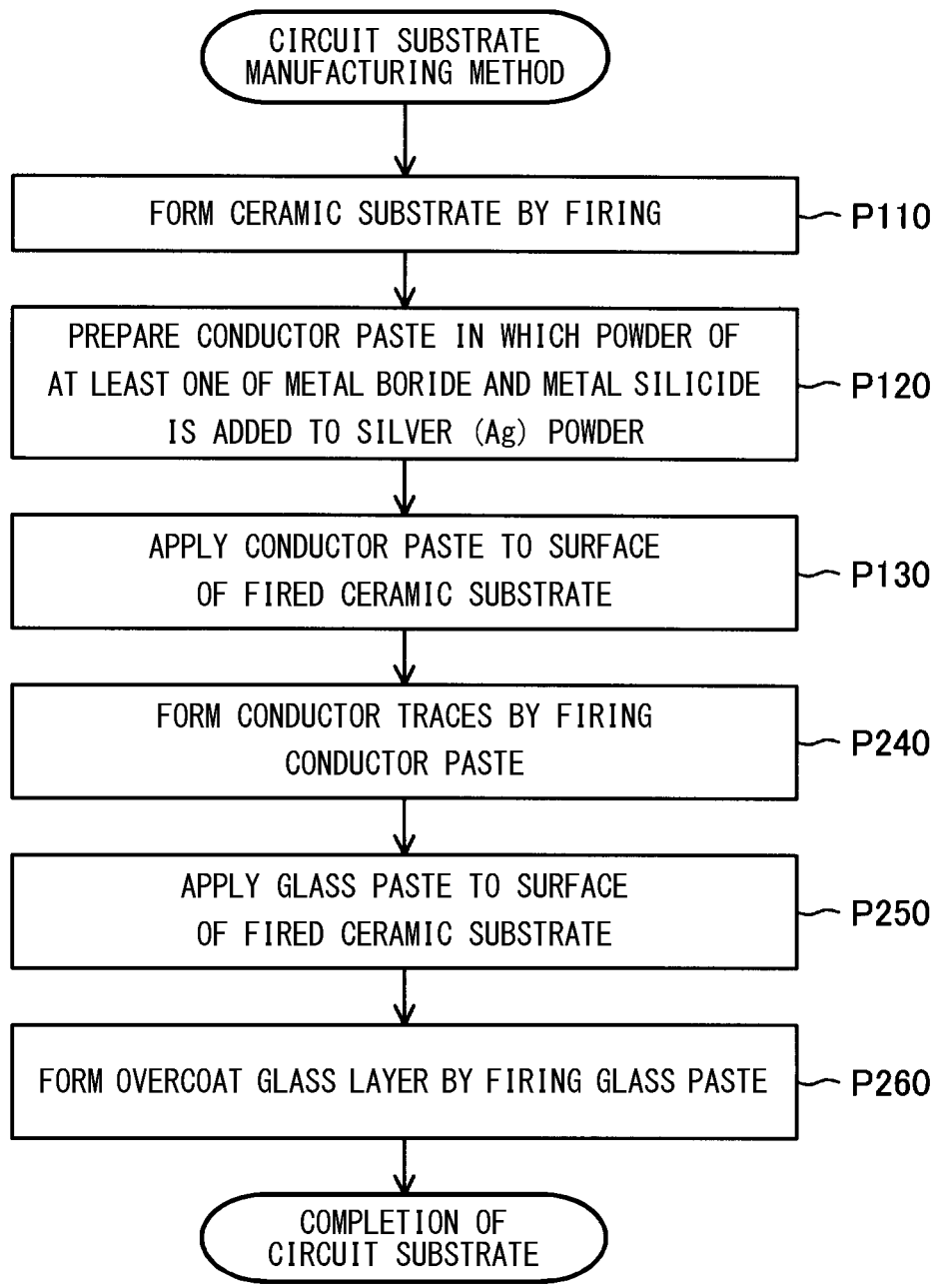
FIG. 4 Flowchart showing a method of manufacturing the circuit substrate according to a second embodiment.

FIG. 4 is a flowchart showing a method of manufacturing the circuit substrate 100 according to a second embodiment. The manufacturing method of the second embodiment is the same as that of the first embodiment except that the steps after applying the conductor paste (step P130) are different.

In the second embodiment, after the conductor paste is applied (step P130), the conductor paste is fired to form the conductor traces 170 (step P240). In the present embodiment, the conductor paste having been applied to the ceramic substrate 110 is fired by being exposed to an atmosphere of 850° C. for 60 minutes. Thus, the conductor traces 170 are formed on the surface 111 of the ceramic substrate 110.

After the conductor traces 170 are formed (step P240), the glass paste which is the material of the coating layer 180 is applied to the surface 111 of the ceramic substrate 110 (step P250). The methods of preparing and applying the glass paste in the second embodiment are the same as those of the first embodiment.

After the glass paste is applied (step P250), the glass paste applied to the surface 111 of the ceramic substrate 110 is fired to form the coating layer 180 (step P260). In the present embodiment, the glass paste applied to the ceramic substrate 110 is fired by being exposed to an atmosphere of 600° C. for 60 minutes. Thus, the coating layer 180 is formed on the surface 111 of the ceramic substrate 110. After these steps, the circuit substrate 100 is completed.

According to the second embodiment, as in the first embodiment, diffusion of the silver component of the conductor traces 170 into the coating layer 180 can be prevented. As a result, it is possible to prevent deterioration of the electrical insulation performance of the coating layer 180 and change of the color of the coating layer 180. Thus, the quality of the circuit substrate 100 can be improved.

After the conductor traces are formed by firing the conductor paste (step P240), the glass paste is applied to the surface 111 of the ceramic substrate 110. As a result, diffusion of the silver component from the conductor traces 170 into the coating layer 180 is prevented to a greater degree.

C. Other Embodiments

The present invention is not limited to the above-described embodiment, examples, and modifications, but may be embodied in various other forms without departing from the spirit of the invention. For example, in order to solve, partially or entirely, the above-mentioned problem or yield, partially or entirely, the above-mentioned effects, technical features of the embodiments, examples, and modifications corresponding to technical features of the modes described in the section "SUMMARY OF THE INVENTION" can be replaced or combined as appropriate. Also, the technical feature(s) may be eliminated as appropriate unless the present specification mentions that the technical feature(s) is mandatory.

In another embodiment, when the conductor paste which is the material of the conductor traces 170 is prepared (step P120), before adding a binder and a solvent to a powder of silver (Ag), a powder of at least one of the metal boride and the metal silicide may be caused to adhere to the surfaces of powder particles of silver (Ag) by adding a powder of at least one of the metal boride and the metal silicide to the silver (Ag) powder. This prevents diffusion of the silver component from the conductor traces 170 into the coating layer 180 to a greater degree.

In still another embodiment, after the conductor paste is applied (step P130), a paste which is the material of resistors may be applied to the ceramic substrate 110 before the glass paste is applied (step P150). The paste which is the material of the resistors may be prepared by kneading the mixture of ruthenium oxide powder, borosilicate glass powder, a binder, and a solvent.

DESCRIPTION OF REFERENCE NUMERALS

100 . . . circuit substrate
110 . . . ceramic substrate
111 . . . surface
112 . . . surface
170 . . . conductor trace
180 . . . coating layer
181 . . . region

What is claimed is:

1. A method of manufacturing a circuit substrate including a ceramic substrate having a surface mainly formed of a ceramic, a conductor trace formed on the surface of the ceramic substrate and mainly formed of silver (Ag), and a coating layer which contains a glass component and which is formed on the surface of the ceramic substrate and covers the conductor trace, comprising:

a step of firing the ceramic substrate;
a step of preparing a conductor paste in which a powder of at least one of a metal boride and a metal silicide is added to a powder of silver (Ag);
a step of applying the conductor paste to the surface of the fired ceramic substrate;
a step of applying a glass paste to the surface of the ceramic substrate after applying the conductor paste;
a step of firing the conductor paste applied to the surface so as to form the conductor trace; and
a step of firing the glass paste applied to the surface so as to form the coating layer;
wherein the step of firing the conductor paste and the step of firing the glass paste occur at the same time and within an atmosphere with oxygen such that the at least one of a metal boride and a metal silicide of the conductor paste is oxidized during the firing step.

2. The method of manufacturing a circuit substrate according to claim 1, wherein the metal boride is at least one of lanthanum hexaboride (LaB6), silicon hexaboride (SiB6), and titanium diboride (TiB2).

3. The method of manufacturing a circuit substrate according to claim 1, wherein the metal silicide is at least one of zirconium disilicide (ZrSi2) and tantalum disilicide (TaSi2).

4. The method of manufacturing a circuit substrate according to claim 1, wherein the total amount of the metal boride and the metal silicide with respect to the amount of the inorganic component of the conductor paste is 3 vol. % to 15 vol. %.

5. The method of manufacturing a circuit substrate according to claim 1, wherein the step of preparing the conductor paste includes a step of causing the powder of at least one of the metal boride and the metal silicide to adhere to surfaces of powder particles of the silver (Ag).

6. The method of manufacturing a circuit substrate according to claim 1, wherein the conductor paste and the glass paste are fired at the same time so as to form the conductor trace and the coating layer at the same time.

* * * * *